United States Patent [19]
Zimmermann

[11] Patent Number: 5,772,792
[45] Date of Patent: Jun. 30, 1998

[54] SOLAR GENERATOR

[76] Inventor: Johann Zimmermann, Santisweg 10, D-88281 Schlier, Germany

[21] Appl. No.: 682,713
[22] PCT Filed: Nov. 21, 1995
[86] PCT No.: PCT/EP95/04570
§ 371 Date: Jul. 30, 1996
§ 102(e) Date: Jul. 30, 1996
[87] PCT Pub. No.: WO96/18235
PCT Pub. Date: Jun. 13, 1996

[30] Foreign Application Priority Data

Dec. 5, 1994 [DE] Germany ............................. 9419371 U

[51] Int. Cl.⁶ .................................................. H01L 31/058
[52] U.S. Cl. ............................................. 136/248; 136/246
[58] Field of Search ..................................... 136/246, 248

[56] References Cited

FOREIGN PATENT DOCUMENTS 0098897   1/1984   European Pat. Off. .

*Primary Examiner*—Nam Nguyen
*Attorney, Agent, or Firm*—Larson & Taylor

[57] ABSTRACT

The invention refers to sun generators, which at the same time deliver warm water and electrical current in the form of direct current (DC) and alternating current (AC) and are working at a large angle range to the emitting radiation and their color can be adapted to that of the environment and which will not freeze at low temperatures.

6 Claims, 2 Drawing Sheets

SOLAR GENERATOR

FIELD OF THE INVENTION

The present invention refers to sun generators which generate electric current while preparing hot water at the same time. Radiation is passed through the sun generator's layers one after the other, with the layers being non-dazzling and adaptable in color for the observer to match the environment of use. The sun generator can be operated over a large angle area (about 230 degrees) relative to the direct radiation incoming to the active surface thereof, and the sun generator may possess a device against freezing.

BACKGROUND OF THE INVENTION

Till now, no solar generators are known which present the characteristics of the present sun generator mentioned above.

In "Hybrid Solar Energy Generating System" by D. E. Soul, U.S. Pat. No. 4,700,013 of 13th Oct., 1987, a system is disclosed which uses fluid-cooled solar cells. Nevertheless, these cells are not cooled directly like in the present sun generator, and the warmth is just received by a holding system.

Moreover, in order to generate electric current and thermal energy at the same time with such a system as disclosed in the Soul patent, expensive devices such as polarization filters are required and the radiation must be divided into long wave and short wave radiation, whereby the efficiency rate of the energy transformation is diminished.

Also the devices to be employed in the Soul patent system are expensive and may be susceptible to failures, so that they are not suitable for small and maintenance-free operating systems like the system of the present sun generator. With the present sun generator, 40 watts of delivered photovoltaic power is constantly produced and additionally up to 100 watts of delivered thermal power have been measured. This may be contrasted with usual separated solar generators which average 25 watts of electrical/50 watts thermal power. Moreover, the temperature of the present and cooled sun generator remained constant during the measuring period (6 hours), whereas the temperature in the usual photovoltaic solar generators rose while the deliverable electric power during measuring time diminished.

DESCRIPTION OF THE PREFERRED EMBODIMENTS

Figure 1:
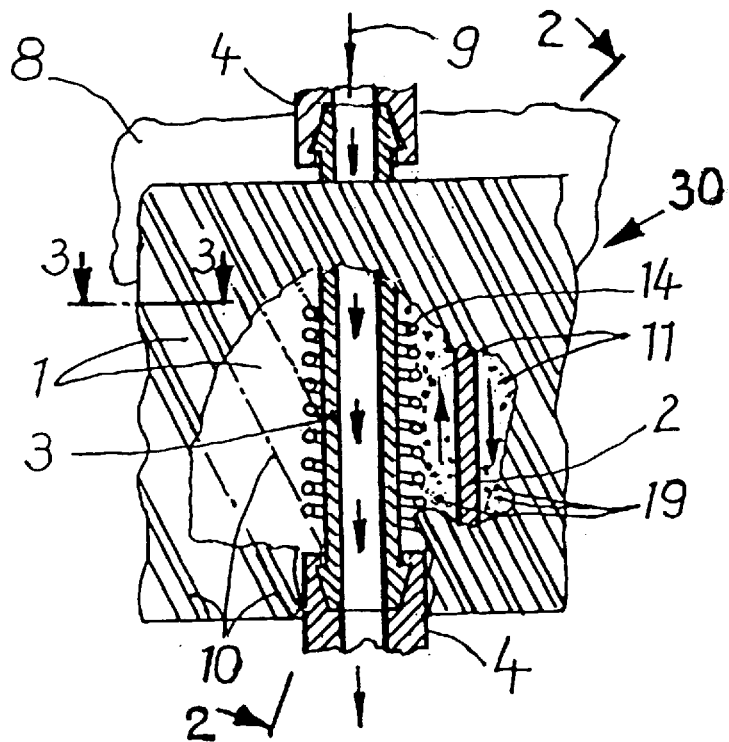
FIG. 1 is a schematic front elevation view of a sun generator according to the present invention with part of an outer side of a winding thereof cut away on the right-hand side, and on the left-hand side the outer side of the winding together with the underlying hose are cut away to reveal the inner side of the winding.
Figure 3:
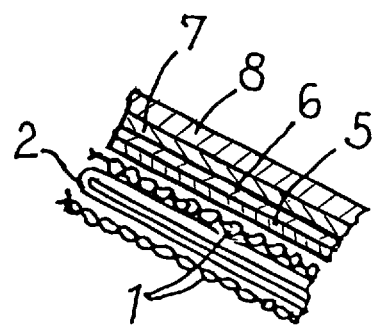
FIG. 3 is a schematic section of a portion of the sun generator depicted in FIG. 1 taken along the line 3—3 in FIG. 1.

The sun generator 30 of the present invention includes an outer hose 2 (note: more than one outer hose 2 is possible if desired, and the left-hand side of hose 2 is omitted from FIG. 1) and an inner hose 3. A winding (or windings) 1 is wound around the hose 2 and (or) the inner hose 3. Winding 1 provides a light transmitting system formed by grooves 10 in elements 17, and by a photovoltaic active coating 13 (only partially shown in FIG. 5) thereon. A permanent or remanent magnetizable medium 11 circulates automatically or by force through hose 2 as shown by the circulation arrows. The transmission of the radiation impinging on the sun generator 30 and hence on the medium 11 or water 9 in hose 3, and on the photovoltaic coating 13, make it possible to transform this radiation of different wavelengths into heat and current without loss. The magnetizable medium 11 is additionally in a by-pass connection to a thermosiphon system active in series connection and including heating resistors 14 and pumps 15. Resistors 14 heat up the magnetizable medium 11 and indirectly the water 9 in the inner tube 3 in a heat exchange relationship. Medium 11 is moved by such heating and/or by pumps 15 for current generating, which is additional to the current generated in the sun generator by photovoltaic coating 13. Thus, a system for induction generation of an efficiency rate of this height till now unknown is provided, together with the generation of e.g. hot water and/or electrical current.

The outer hose 2 and inner hose 3 of the thus integrated heat changer transform the radiation directly, or indirectly via a system of resistances and Foucault current, in the sun generator 30 of the present invention. In addition, resistors 14 totally or partially are also used to protect against freezing of the transport medium 11 for heat exchange and the medium 9 in the inner tubes.

The winding 1 is preferably manufactured of colorable plastic, or any other suitable material such as light transmitting fibers. Winding 1 is a system for receiving the light/radiation, as well as optionally providing a base for an electrical/magnetical or other acting field. In the preferred embodiment, winding 1 is a compact system of lenses, and is provided with all suitable cross sections or thicknesses and preferably with grooves 10, or as an energy transporting mechanism winding 1 can be layered/bundled. Winding 1 also has an energy-transforming (photovoltaic) coating 13 as noted above e.g., doped silicon layers, as disclosed in patent application DE 42 05 721.

Figure 5:
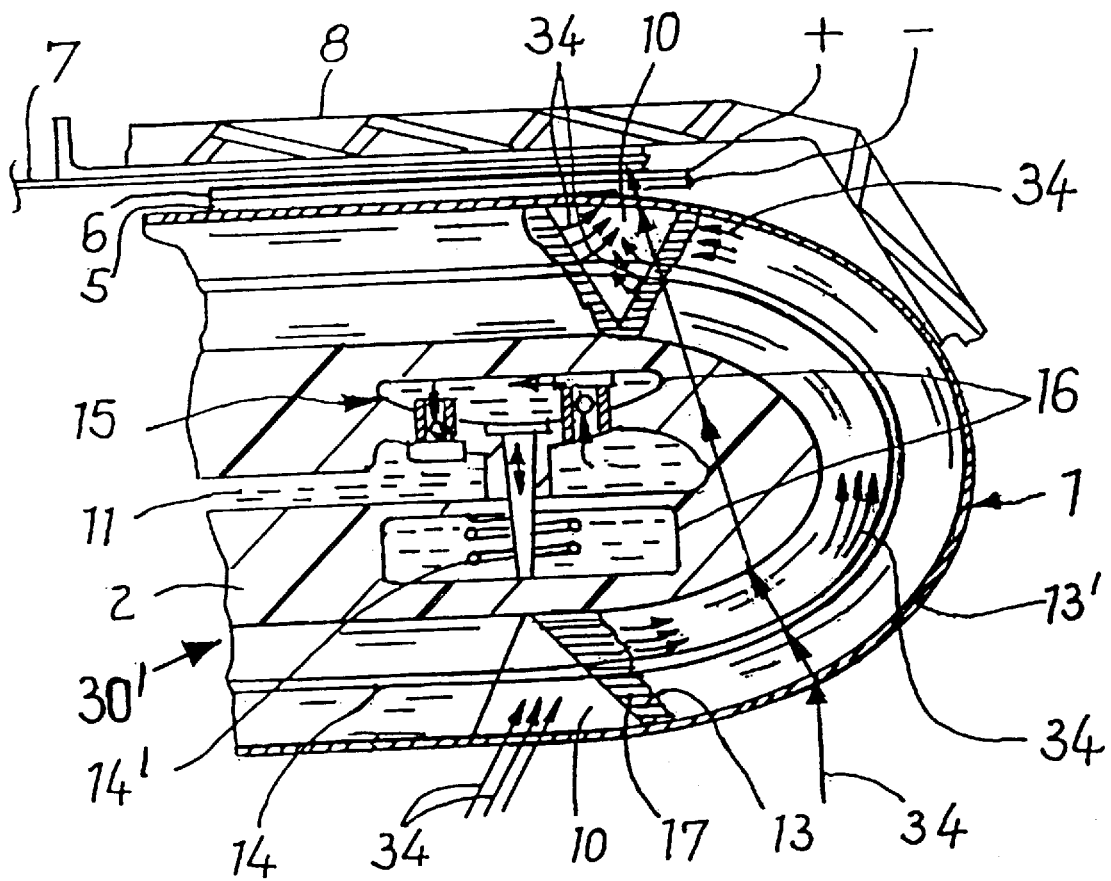
FIG. 5 is an enlarged view of a right-hand end of an alternative sun generator similar to that depicted in FIG. 4.

In an alternative embodiment as shown in FIG. 5, the winding 1 is a light transmitting fiber/energy transporter which is surface-covered with a vaporized coating 13' of a mixture of powdered substances and hardening working material according to the disclosures of patent applications PCT/DE90/00891, EP 90917048.2-2309/0512998 and DE 39 38 881. This makes possible the combination of photovoltaics and thermics for obtaining of energy with the present invention.

Figure 2:
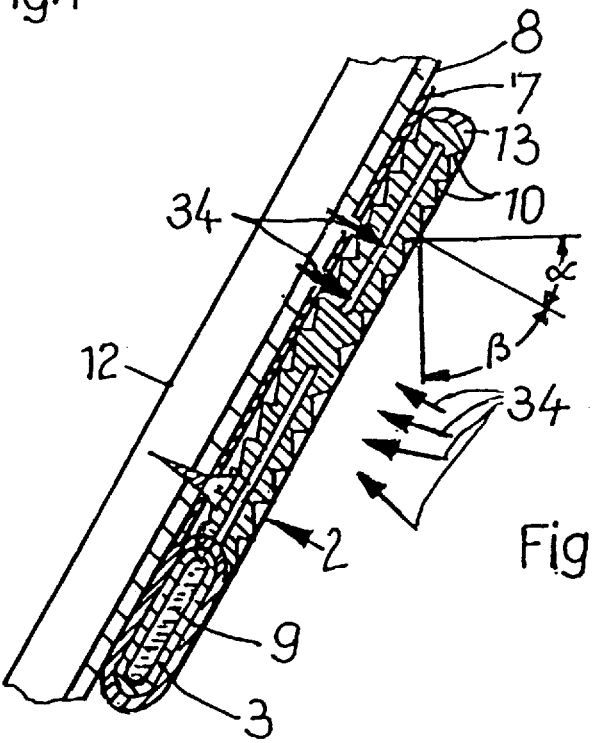
FIG. 2 is a mostly elevation schematic section of the sun generator depicted in FIG. 1 taken along the line 2—2 in FIG. 1.
Figure 4:
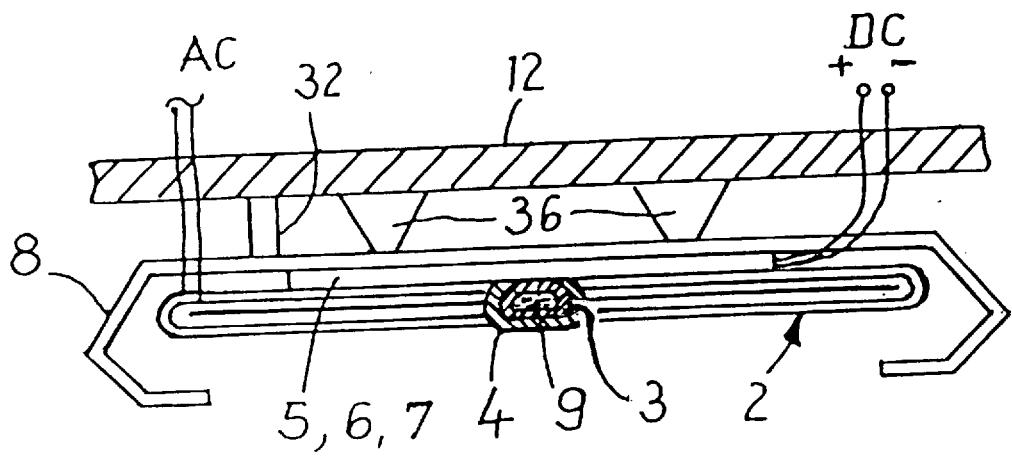
FIG. 4 is a schematic top plan view of the sun generator depicted in FIG. 1.

Preferably, the sun generator 30 can be mounted on a house wall 12 as shown, or on house roofs or by themselves. However mounted, the integrated heat exchanger intercepts sun light/radiation and is heated thereby. The grooves 10 of the winding 1 around the hose 2 internally reflect or transmit the sun light/radiation from an observing angle of about −60 degrees and +60 degrees ($\alpha$, $\beta$) from the normal to the surface as seen in FIG. 2. And, due to the construction of winding 1 containing grooves 10 in the transparent plastic or of any suitable material thereof, reflected light/radiation over an angle of more than e.g. ±60 degrees (for the angles $\alpha$ and the angles $\beta$) is transmitted onto the surface of the hose 2 through the winding 1.

An observer from a bird's eye perspective at an angle $\alpha$ of more than approximately 30 degrees sees the sun generator 30 as a black surface, optically deformed by this view-point to a smaller overall length than its actual length. That means that the sun generator's surface which is at disposal for the adsorption of sun radiation (i.e., the effective surface measured perpendicular to the impinging radiation) according to the sun's position in comparison with the largest surface, is a height or length (at the same relative measurements of horizontal collectors/positions) which is apparently smaller. That however is without any disadvantage as the normally existing perpendicular surfaces on house walls, which till now were mostly unused for that purpose, can now be employed without concern for their less than favorable orientation. The sun generator 30 of this construction now can be adapted to all usual house wall colors, what is indispensable for esthetic reasons when using the surfaces of a house which are typically perpendicular and unusable for esthetic reasons. Prior to this invention, no working material or combined material was known which internally reflects light depending on direction and which respectively can transmit partially at the same time.

For convenience, the light transmitting parts are hereafter called optical transmitting lenses. The frontal side of these lenses are approximately kept positioned opposed to the direct direction of the sun light, while the outer surface is photovoltaicly active. These lenses emit radiation to the collector foil 13 and direct light/radiation reflecting perpendicularly to the main axes thereof to the foil 13 as well. By means of manufacturing, the winding 1 surrounds the hose 2. The winding part mounted on the reverse (inner side) of the hose 2, which hose 2 is flat pressed with the inner hose 3, is one or several closely lying windings of transparent plastic or of any other suitable material, and has beams impinging on its reflecting surfaces. The lenses (acting now as prisms—which can have also other geometrical and/or non-geometrical definable shapes) provide for reflection and/or light/radiation emission, or for light transmission totally or partially via the system of lenses and/or the light transporting system (via fiber bundles or light transmitters 17 schematically shown as FIG. 5) to the coatings of the photovoltaic elements 13, 5 and 6, and to other such elements in/on the hose 2 and the winding 1.

The circuit, like that from the delivered direct current (DC), is generated as an alternating current (AC). A magnetic field is provided around the expanded metal 8 of iron material, or around any other remanent and/or permanent magnetizable material, e.g., elementary magnets 19 in the mixture of glycol and water mixed in a 50:50 rate as medium 11. The magnetic field transports finely dispersed remanent and/or permanent magnetic particles by the thermosiphon effect. This thermosiphon effect is supported by the thermal effect of heating resistances 14 and/or by a pumping effect of the pumps 15.

FIG. 2 shows, with arrows 34 arranged under different angles and perpendicularly, the emission of radiation 34 from the lenses which heats the medium 11 causing it to flow (or by radiation 34 at any angle hitting on the sun generator). With the medium 11 flow in the magnetic field of the expanded metal 8 (or of any other suitable magnetic/electrical transmitter), there is delivered an inductive current (an alternating current) to the connections 7 and leads labeled "AC". This generation of alternating current by flowing of hot water at the same time is unique. The heat exchange from the generator to the store or reservoir for warm water is realized in the sun generator 30 of the present invention in the inner tube 3 filled with water 9 as the heat flux passes through the tube wall of the hose 2 and the transporting medium 11 and elementary magnetic particles surrounding the tube 3.

The expanded metal 8 is a support for the hose 2, the surrounding windings 1, the inner tube 3, the connecting pieces 4, the electrical resistances (elements 5 and 6 and connection 7), and the photovoltaic coating or covering 13 on the various elements 5, 6, 17, 10. The expanded metal 8 is screwed with screws 32 and plugs 36 on a house wall 12 or the like and is additionally mounted with quick binding concrete or the like (not shown) in order to keep a distance from the wall correct and for additional fastening. The inner tube 3 is preferably of a harder material than the connecting pieces 4 and the hose 2, so that for fastening thereof there is used the adhering tightening and sealing system known in utility model G 9207218.6 and registered according to PCT/EP92/01181. In that system the mandrel, here in the inner hose 3, opens out at each end for connection to the connecting pieces 4, and hence hose 3 gets pulled tighter with increasing tension load. A light upsetting or compression, however, is sufficient to loosen the connection made in a relatively easy way.

In the version shown according to FIG. 1, the material used for the hose 2 is an elastomer thermoplastic stable at over 140° C. of ethylene-butylene-polystryol. This material is transparent for light and can be colored in any color. Moveover, this material is resistant to low temperatures and can be very well welded with polypropylene. Preferably the inner tube 3 uses the same material as for the hose 2, but in order to obtain the necessary hardness the material of hose 3 is an irradiation cross-linked version. The winding 1 is a transparent polymethylmetaacrylate (PMMA), for example extruded as mass pre-material from granulate. The cross section form of the winding 1 material is lens-shaped, and it is thus appropriate for winding around the hose 2 in one coil or several. The grooves 10 can be provided in the winding 1 before or after winding around the hoses 2, 3 or 2 and 3. The hose 3 is manufactured according to the procedure indicated in the patent application P 4142684.3 and with the machines and tools according to G9106626.3, and further according to DE 3938811 A1, DE 4037201 A1, PCT/DE90/00891, DE 4140875 A1, G8913795.7 and DE 4201759.

After winding around, the winding 1 together with the inside formed inner tube 3 are pressed flat according to PCT/DE90/00891 and, as the case may be, provided with grooves 10.

The sun generator 30 is mainly made of thermoplastic, which permits operation in a temperature range from about minus 70 degrees up to plus 170 degrees Celsius. According to patent application DE 4205721, there is also produced a highly solid, radiation resistant, form stable, printable and temperature resistant foil covered photovoltaic elements 5, 6 and 13.

Lateral framework members or sparings 16 are provided with fabric inlays, which inlays minimize the expansion and have integrated therein zones of the laminate foils. The fabric inlay of this combined working material is covered by plastic; and electrical spools 14 and pumps 15 are provided as shown. According to the invention, there are available printable plastic foils with several coatings of the photovoltaic elements, e.g., in the high-vacuum processing, by evaporating of a silicon compound on highly flexible thin plastic foils of about only 0.2 mm thickness to the already printed connections.

The laminated foils are bonded to each other by welding or by gluing, have about a 0.3 mm thickness, have connections 7 and inlaying electronic components, and are gastight. The fluid filled tube 2 and the inner tube 3 are then fitted one into each other and flat pressed so that they form multilayer photovoltaic elements out of about 10 single plastic foils with evaporated photovoltaic coating thereon together with the coated elements 17 located in the winding 1 which arise from the grooves 10 on the front part of the windings 1.

The basic working material is produced from irradiation cross-linked plastic of e.g. a ethylene/butylene/polystyrol mixture, with the glass fiber and the covered glass fiber fabric being rolled at the same time. The temperature resistance and the working material characteristics of raising filling materials being obtained, at the same time that calibration of the basic working material foils and the laminate manufactured therefrom are produced, using e.g., a silicon compound material.

In this version, the photovoltaicly generated current is partially used to transport/circulate the elementary magnets in the magnetic/magnetizable fluid 11, supporting the thermosiphon effect by sun irradiation with the help of the membrane 15 and/or heating resistances 14 provided as resistance coils around the inner tubes 3 and passing heat indirectly to the tube 2.

In this version the sun generator 30 is totally only about 12 mm thick and can be coiled in a roll, and in coiled form it can be hung on house walls and easily removed therefrom.

I claim:

1. A sun generator comprising:

an inner tube filled with a first fluid;

an outer tube surrounding said inner tube and filled with a second fluid in which magnetic particles are suspended, said first and second fluids being in a heat exchange relationship;

an electrical heating element adjacent said inner tube and inside of said outer tube;

a system of lenses located on said outer tube, said system of lenses receiving radiation and reflecting a part of the received radiation to said outer tube and said inner tube for heating of said first and second fluid mediums;

a photovoltaic material integral with said system of lenses which produces a direct current when radiation impinges thereon, which direct current produces an active electromagnetic field in said material;

a first circulating means for circulating said second fluid and the magnetic particles therein in said outer tube whereby said magnetic particles circulating in said second fluid generate an alternating current in conjunction with the electromagnetic field which is applied to said heating element to heat said second fluid directly and hence said first fluid; and a second circulating means for circulating said first fluid to obtain heat energy from said first fluid and to cool said second fluid.

2. A sun generator as claimed in claim 1:

wherein said system of lenses is provided as a winding attached about said outer hose, said winding including a series of grooves on an outer surface thereof.

3. A sun generator as claimed in claim 1:

wherein said second fluid is a liquid including an antifreeze agent therein; and wherein said magnetic particles are one of permanent or remanent magnetic particles.

4. A sun generator as claimed in claim 1:

further including an expanded metal base to which said inner hose and said outer hose are mounted and which is adapted for mounting on a vertical structure.

5. A sun generator as claimed in claim 1:

wherein said inner tube and said outer tube are made from a colorable thermoplastic elastomer which is transparent; and wherein said system of lenses is made from a material which is colorable.

6. A sun generator as claimed in claim 1:

wherein said system of lenses is a radiation-transporting bundle of fibers; and wherein said photovoltaic material is integral with said fibers.

* * * * *